United States Patent
Hu et al.

(10) Patent No.: US 11,271,051 B2
(45) Date of Patent: Mar. 8, 2022

(54) LIGHT SOURCE PANEL AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Weipin Hu, Beijing (CN); Xiang Feng, Beijing (CN); Congcong Wei, Beijing (CN); Chun Wang, Beijing (CN); Mingxiao Jiang, Beijing (CN); Xiao Sun, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 870 days.

(21) Appl. No.: 16/068,281

(22) PCT Filed: Dec. 1, 2017

(86) PCT No.: PCT/CN2017/114239
§ 371 (c)(1),
(2) Date: Jul. 5, 2018

(87) PCT Pub. No.: WO2018/188354
PCT Pub. Date: Oct. 18, 2018

(65) Prior Publication Data
US 2021/0202619 A1 Jul. 1, 2021

(30) Foreign Application Priority Data

Apr. 10, 2017 (CN) .......................... 201710229226.2

(51) Int. Cl.
*G02F 1/13357* (2006.01)
*H01L 27/32* (2006.01)
(Continued)

(52) U.S. Cl.
CPC .......... *H01L 27/3232* (2013.01); *G02B 30/31* (2020.01); *G02F 1/1347* (2013.01);
(Continued)

(58) Field of Classification Search
CPC ....................................... G02B 30/31
(Continued)

(56) References Cited

U.S. PATENT DOCUMENTS

2006/0262242 A1 11/2006 Koma
2008/0192156 A1 8/2008 Hamagishi et al.
(Continued)

FOREIGN PATENT DOCUMENTS

CN 101241252 2/2008
CN 104730719 A 6/2015
(Continued)

OTHER PUBLICATIONS

Chinese Office Action in corresponding Chinese Application No. 201710229226.2 dated Jan. 22, 2020 (an English translation attached hereto). 14 pages.
(Continued)

*Primary Examiner* — Christopher M Raabe
(74) *Attorney, Agent, or Firm* — Leason Ellis LLP

(57) ABSTRACT

A light source panel and a display device are disclosed. The display device includes: a display panel of reflection type and a light source panel disposed on a light emitting side of the display panel, the light source panel includes a parallax barrier structure and light emitting units, the parallax barrier structure includes light splitting components, the light splitting components include at least a non-transparent state, the light transmission areas are located in spaces between adjacent splitting light components, and the light emitting units at least partially overlap with the light splitting components in a direction perpendicular to the light source panel.

20 Claims, 5 Drawing Sheets

(51) Int. Cl.
*G02B 30/31* (2020.01)
*G02F 1/1335* (2006.01)
*G02F 1/1347* (2006.01)
*G02F 1/157* (2006.01)
*H01L 51/50* (2006.01)
*H01L 51/52* (2006.01)

(52) U.S. Cl.
CPC .. *G02F 1/133528* (2013.01); *G02F 1/133562* (2021.01); *G02F 1/133567* (2021.01); *G02F 1/133603* (2013.01); *G02F 1/157* (2013.01); *G02F 2201/30* (2013.01); *G02F 2203/02* (2013.01); *H01L 27/3244* (2013.01); *H01L 27/3283* (2013.01); *H01L 51/504* (2013.01); *H01L 51/5218* (2013.01)

(58) Field of Classification Search
USPC .......................................................... 349/33
See application file for complete search history.

(56) References Cited

U.S. PATENT DOCUMENTS

2017/0048516 A1 2/2017 Yang et al.
2018/0004019 A1* 1/2018 Im ....................... H04N 13/261

FOREIGN PATENT DOCUMENTS

| CN | 105717688 A | 6/2016 |
| CN | 106098737 A | 11/2016 |
| CN | 106992202 A | 7/2017 |
| JP | 2007041536 A | 2/2007 |

OTHER PUBLICATIONS

International Search Report and Written Opinion in corresponding International Patent Application No. PCT/CN2017/114239, dated Feb. 23, 2018. 18 pages. (An English translation attached.).
Chinese Office Action in corresponding Chinese Application No. 201710229226.2 dated Apr. 30, 2019 (an English translation attached hereto). 14 pages.

* cited by examiner

LIGHT SOURCE PANEL AND DISPLAY DEVICE

CROSS-REFERENCE TO RELATED PATENT APPLICATIONS

The application is a U.S. National Stage Application under 35 U.S.C. § 371 of International Patent Application No. PCT/CN2017/114239 filed Dec. 1, 2017, which claims priority to the Chinese patent application No. 201710229226.2, filed on Apr. 10, 2017, both of which are incorporated herein by reference in their entireties as part of the present application.

TECHNICAL FIELD

At least one embodiment of the present disclosure relates to a light source panel and a display device.

BACKGROUND

Compared with a transmissive display device, a reflective display device has advantages such as a softer image, lower power consumption, and getting better display effect in situations such as outdoors, so that the reflective display device is increasingly favored in fields such as e-books and the like.

The reflective display device is greatly affected by external ambient light, and the display effect is reduced when the external ambient light is insufficient.

SUMMARY

At least one embodiment of the present disclosure provides a display device, comprising: a display panel of reflection type; and a light source panel disposed on a light emitting side of the display panel and being parallel to the display panel, the light source panel including a parallax barrier structure and light emitting units, and the light emitting units being capable of irradiating the display panel during operation, wherein the light source panel comprises light emitting areas and light transmission areas, the light emitting units are disposed in the light emitting areas, and the parallax barrier structure is disposed on one side of the light emitting units away from the display panel, the parallax barrier structure comprises light splitting components, the light splitting components comprise at least a non-transparent state, the light transmission areas are located in spaces between adjacent light splitting components, and the light emitting units at least partially overlap with the light splitting components in a direction perpendicular to the light source panel.

For example, in the display device according to at least one embodiment of the present disclosure, orthographic projections of the spaces between the adjacent light splitting components on a surface where the light source panel is located coincide with orthogonal projections of the light transmission areas on the surface where the light source panel is located.

For example, in the display device according to at least one embodiment of the present disclosure, orthographic projections of the light emitting units on the surface where the light source panel is located are located within orthogonal projections of the light splitting components on the surface where the light source panel is located.

For example, in the display device according to at least one embodiment of the present disclosure, the light emitting units are organic light emitting devices, and each of the organic light emitting devices comprises at least a first electrode layer, a light emitting layer and a second electrode layer that are sequentially stacked on top of each other, the first electrode layer is disposed on a side of the light emitting layer away from the display panel, and the second electrode layer is a transparent electrode.

For example, in the display device according to at least one embodiment of the present disclosure, the light emitting layer is a white light emitting layer or comprises a red light emitting layer, a green light emitting layer and a blue light emitting layer that are stacked on top of each other.

For example, in the display device according to at least one embodiment of the present disclosure, the light source panel further comprises a pixel definition layer for defining the light emitting units, and the pixel definition layer comprises a transparent material and extends into the light transmission area.

For example, in the display device according to at least one embodiment of the present disclosure, the first electrode layer is a non-transparent electrode, and the first electrode layer is configured for the light splitting components of the parallax barrier structure.

For example, in the display device according to at least one embodiment of the present disclosure, the parallax barrier structure comprises a black matrix as the light splitting components, and the first electrode layer is at least partially overlapped with the black matrix.

For example, in the display device according to at least one embodiment of the present disclosure, the first electrode layer is a reflective electrode, and an orthographic projection of the first electrode layer on the surface, where the light source panel is located, is located within an orthogonal projection of the black matrix on the surface where the light source panel is located.

For example, in the display device according to at least one embodiment of the present disclosure, the parallax barrier structure is a liquid crystal grating or an electrochromic grating, and the liquid crystal grating or the electrochromic grating comprises portions that are transformed into a non-transparent state after being applied with a voltage signal and functions as the light splitting components, and the first electrode layer is a transparent electrode.

At least one embodiment of the present disclosure provides a light source panel, the light source panel comprises a parallax barrier structure and light emitting units, wherein the parallax barrier structure comprises a plurality of light splitting components, the light splitting components comprise at least a non-transparent state, and the light transmission areas are located in spaces between adjacent light splitting components, and the light emitting units at least partially overlap with the light splitting components in a direction perpendicular to the light source panel.

For example, in the light source panel according to at least one embodiment of the present disclosure, the light emitting units are organic light emitting devices, and each of the organic light emitting devices comprises at least a first electrode layer, a light emitting layer and a second electrode layer that are sequentially stacked on top of each other.

For example, in the light source panel according to at least one embodiment of the present disclosure, the first electrode layer is a non-transparent electrode, and the first electrode layer is configured for the light splitting components of the parallax barrier structure.

For example, in the light source panel according to at least one embodiment of the present disclosure, the parallax barrier structure comprises a black matrix as the light splitting components, and the first electrode layer is at least partially overlapped with the black matrix.

For example, in the light source panel according to at least one embodiment of the present disclosure, the first electrode layer is a reflective electrode, and an orthographic projection of the first electrode layer on the surface, where the light source panel is located, is located within an orthogonal projection of the black matrix on the surface where the light source panel is located.

For example, in the light source panel according to at least one embodiment of the present disclosure, the parallax barrier structure is a liquid crystal grating or an electrochromic grating, and the liquid crystal grating or the electrochromic grating comprises portions that are transformed into a non-transparent state after being applied with a voltage signal and functions as the light splitting components.

BRIEF DESCRIPTION OF THE DRAWINGS

In order to demonstrate clearly technical solutions of the embodiments of the present disclosure, the accompanying drawings in relevant embodiments of the present disclosure will be introduced briefly. It is apparent that the drawings may only relate to some embodiments of the disclosure and are not intended to limit the present disclosure.

DETAILED DESCRIPTION

Figure 1:
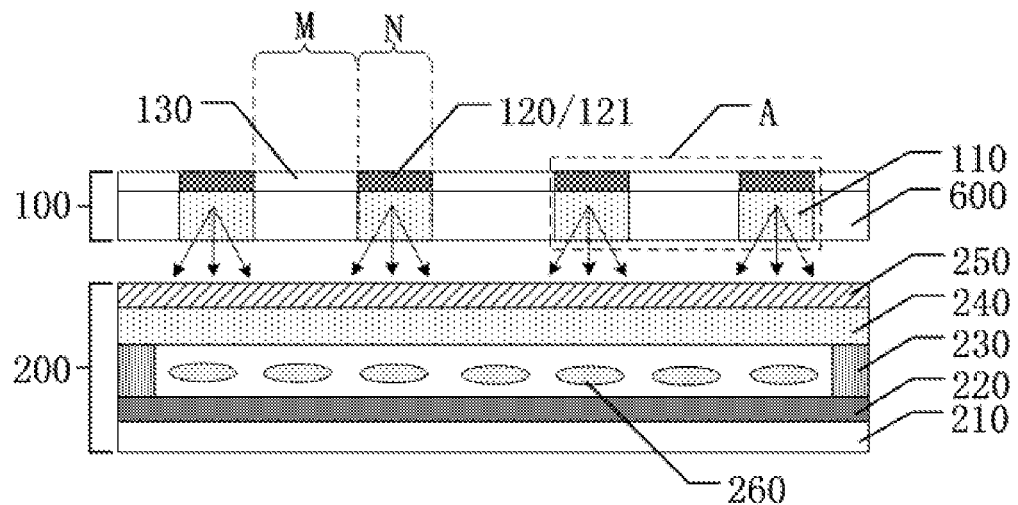
FIG. 1 is a schematic structural diagram of a display device according to an embodiment of the present disclosure.

In order to make objects, technical details and advantages of the embodiments of the disclosure apparent, the technical solutions of the embodiment will be described in a clearly and fully understandable way in connection with the drawings related to the embodiments of the disclosure. It is apparent that the described embodiments are just a part but not all of the embodiments of the disclosure. Based on the described embodiments herein, those skilled in the art can obtain other embodiment, without any creative work, which shall be within the scope of the disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

In order to achieve a mode switching between outdoors and indoors, a front light source can be disposed on a display panel of a reflective display device. Providing the front light source on a display side of the display panel can solve a problem of poor display effect caused by insufficient light from external environment, but the display device having this structure is generally used only for displaying two-dimensional images and does not satisfy the user's further requirements of displaying three-dimensional images or even a function of switching the images between two-dimensional and three-dimensional.

At least one embodiment of the present disclosure provides a light source panel and a display device to solve above-mentioned technical problems. The display device can comprise a display panel of reflection type and a light source panel disposed on a light emitting side of the display panel and being parallel to the display panel, the light source panel including a parallax barrier structure and light emitting units, and the light emitting units being capable of irradiating the display panel during operation. The light source panel comprises light emitting areas and light transmission areas, the light emitting units are disposed in the light emitting areas, and the parallax barrier structure is disposed on one side of the light emitting units away from the display panel, the parallax barrier structure comprises light splitting components, the light splitting components comprise at least a non-transparent state, portions of the adjacent light splitting components correspond to the light transmission areas of the light source panel (for example, the light transmission areas are located in spaces between adjacent light splitting components), and the light emitting units at least partially overlap with the light splitting components in a direction perpendicular to the light source panel. The light emitting unit is able to provide a light source to the display panel of reflection type to enhance display effect of the display device, in this situation, the parallax barrier structure is disposed in the light source panel, so that the display device can have a three-dimensional display function.

In the following, a light source panel and a display device according to at least one embodiment of the present disclosure will be described with reference to the accompanying drawings.

At least one embodiment of the present disclosure provides a display device, FIG. 1 is a schematic structural diagram, which is a sectional view, of a display device according to an embodiment of the present disclosure. For example, as shown in FIG. 1, a display device comprises a light source panel 100 and a display panel 200 of reflection type, the light source panel 100 comprises a parallax barrier structure 120 and a light emitting layer 600, and light emitting units 110 are disposed in the light emitting layer 600, and the light emitting units 110 are able to irradiate the display panel 200 during operation; and the light source panel 100 comprises light emitting areas N and light transmission areas M, the light emitting units 110 are disposed in the light emitting areas N, and the parallax barrier structure 120 is disposed on one side of the light emitting units 110 away from the display panel 200, the parallax barrier structure 120 comprises light splitting components 121, and the light splitting components 121 comprise at least a non-transparent state, and the light emitting units 110 at least partially overlap with the light splitting components 121 in a direction perpendicular to the light source panel 100, the light transmission areas 130 are located in spaces between adjacent light splitting components 121, and the light transmission areas 130 are disposed corresponding to the display panel 200.

The display panel 200 of reflection type mainly reflects light from external environment to achieve to display images, so the effect of the displaying images is greatly affected by light intensity of the light from the external environment. The light emitting units 110 in the light source panel 100 can provide light for the display panel 200, in the case where the light of the external environment is insufficient, for example, when the ambient light in the indoor is weak, a front light source can be provided to ensure display effect of the images of the display device.

It should be noted that the position of the light transmission areas are defined by the light splitting components in at least one embodiment of the present disclosure. For example, as shown in FIG. 1, in the light source panel 100, the areas between the adjacent light splitting components 121 are the light transmission areas 130.

For example, in at least one embodiment of the present disclosure, as shown in FIG. 1, orthographic projections of the areas between adjacent light splitting components 121 on the surface where the light source panel 100 is located coincide with the light transmission areas M. Exemplarily, in the light source panel 100, the light splitting components 121 define the light transmission areas M, that is, the areas between the light splitting components 121 are the light transmission areas M.

In a direction perpendicular to the light source panel 100, the light splitting components 121 are overlapped with the light emitting units 110, in the case where the light splitting components 121 are non-transparent, the light splitting components 121 can prevent the light emitted by the light emitting units 110 from being directly emitted from the display device and from interfering with the display images, thereby ensuring the display effect of the display device.

For example, in at least one embodiment of the present disclosure, as shown in FIG. 1, orthographic projections of the light emitting units 110 on the surface, where the light source panel 100 is located, are located within orthogonal projections of the light splitting components 121 on the surface where the light source panel 100 is located. In this way, for example, in the case where the light splitting components 121 are in a non-transparent state, the light emitted by the light emitting units 110 is blocked by the light splitting components 121, and the light emitted by the light emitting units 110 is prevented from being directly emitted from the display device and from affecting the display effect of the display device. It should be noted that the relative positions of the light emitting units 110 and the light splitting components 121 are not limited to above-mentioned modes, in the case where the display function of the display device is ensured, the light splitting components 121 can partially overlap with the light emitting units 110.

Figure 2:
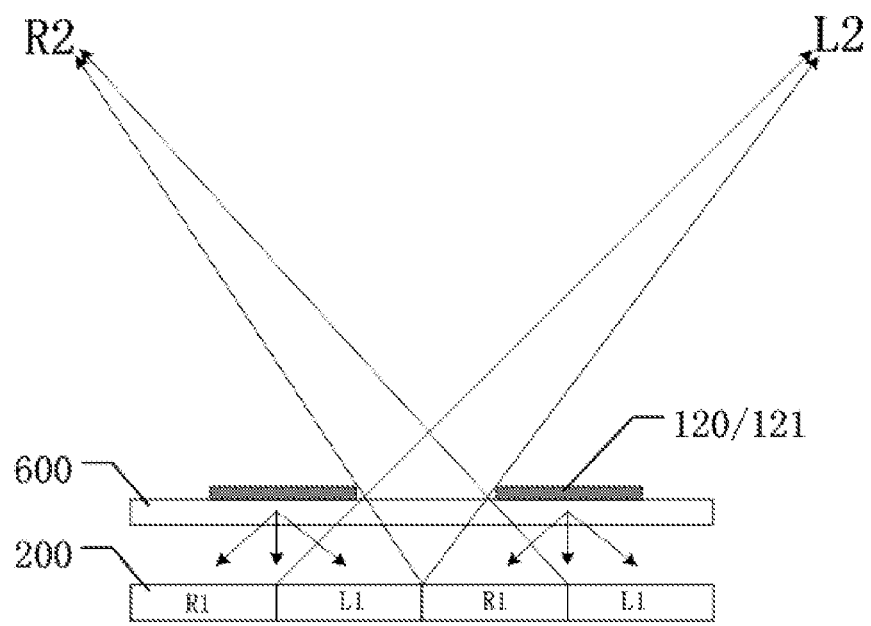
FIG. 2 is a schematic diagram of an optical path of the display device shown in FIG. 1.

A main principle of the naked-eye three-dimensional display is to receive different parallax images through two eyes of an user. After the parallax images are analyzed by the brain, the user creates a sense of depth in the received parallax images, thereby generating a sense of a three-dimensional effect. FIG. 2 is a schematic diagram of an optical path of the display device shown in FIG. 1. For example, as shown in FIG. 2, the display panel 200 comprises a plurality of pixel units, wherein the pixel units R1 can provide a first parallax image R2 (for example, a right-eye image) and the pixel units L1 can provide a second parallax image L2 (for example, a left-eye image), and the parallax barrier structure 120 is disposed on the light exiting side of the display panel 200, so the first parallax image R2 and the second parallax image L2 are able to be respectively displayed at different positions, for example, received by the right eye and the left eye of the user respectively, that is, the right eye and the left eye of the user receive the first parallax image R2 and the second parallax image L2 respectively, thereby a naked-eye three-dimensional display can be achieved.

It should be noted that, in the embodiments of the present disclosure, the positional relationship between the light splitting components 121 in the light source panel 100 and the pixel units (for example, R1 and L1, etc.) of the display panel 200 is not limited, as long as the display images of the display panel 200 become parallax images after passing through the light splitting components 121 of the parallax barrier structure 120.

For example, the light splitting components 121 can divide the parallax images for each column of pixel units. Exemplarily, as shown in FIG. 2, for example, for each column of the pixel units (the pixel units of the column where the pixel units R1 are located and the pixel units of the column where the pixel units L1 are located), each of the light splitting units 121 may be disposed between each adjacent R1 column pixel unit and L1 column pixel unit, thus, the images displayed by each adjacent R1 column pixel unit and L1 column pixel unit are located in different parallax images.

For example, the light splitting components 121 can divide the parallax images of a plurality of columns of pixel units. Exemplarily, as shown in FIG. 2, the R1 areas comprise a plurality of columns of adjacent pixel units, and the L1 areas also comprise a plurality of columns of adjacent pixel units. Each of the light splitting components 121 may be disposed between each adjacent R1 area and L1 area, and thus, the image displayed by pixel units in the R1 area and the image displayed by pixel units in the L1 area, which is adjacent to the R1 area, are located in different parallax images.

In the embodiments of the present disclosure, the connection relationship between the light source panel 100 and the display panel 200 is not limited, provided that the light emitted by the light source panel 100 can enter the display panel 200, and the light is reflected by the display panel 200 and then passes through the light source panel 100 to display images. Exemplarily, the light source panel 100 and the display panel 200 can be fixed by an external frame, and the light source panel 100 is fixed on a light emitting side of the display panel 200. Exemplarily, an optical glue layer may be disposed between the light source panel 100 and the display panel 200, and the light source panel 100 is attached on the light emitting side of the display panel 200 through the optical glue layer.

In the following, the structures of the light source panel and the display panel in the display device will be described respectively.

In the display device provided by the embodiments of the present disclosure, types of the light emitting units in the light source panel are not limited. As shown in FIG. 1, provided that the light emitting units 110 may be at least partially overlapped with the light splitting components 121, and may provide a light source to the display panel 200. For example, the light emitting units 110 may be a stripe light source, an organic light emitting device, or the like. In order to facilitate the explanation of the technical solution of the present disclosure, in the following embodiments of the present disclosure, the light emitting units 110 are organic light emitting devices, which is taken as an example to describe the present disclosure.

Figure 3A:
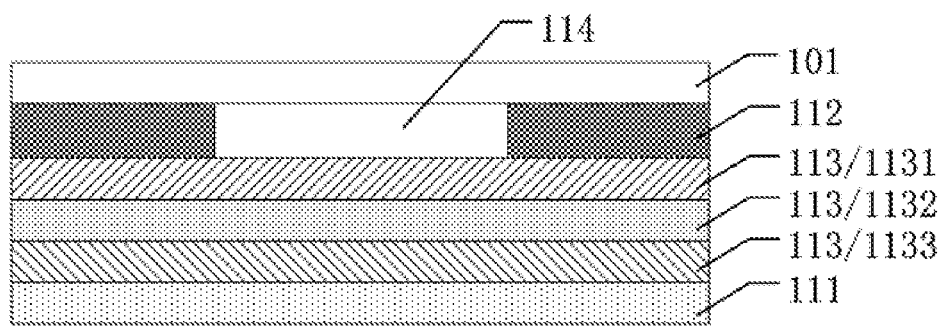
FIG. 3a is a schematic structural diagram of the area A shown in FIG. 1.

In a display device according to at least one embodiment of the present disclosure, FIG. 3a is a schematic structural diagram, which is a sectional view, of the area A shown in FIG. 1. For example, as shown in FIG. 1 and FIG. 3a, the light emitting units 110 are organic light emitting devices, and each of the organic light emitting devices may comprise at least a first electrode layer 112, a light emitting layer 113, and a second electrode layer 111 that are sequentially stacked on top of each other, and the first electrode layer 112 is disposed on a side of the light emitting layer 113 away from the display panel 200. The organic light emitting devices provide light sources for the display panel 200, so the light emitted by the light emitting layer 113 needs to pass through the second electrode layer 111. That is, in the embodiment of the present disclosure, the second electrode layer 111 is at least a half-transparent electrode, and for example, the second electrode layer 111 may be a transparent electrode.

In a display device provided by at least one embodiment of the present disclosure, as shown in FIGS. 1 and 3a, the organic light emitting devices (for example, the light emitting units 110) can emit white light, blue light, other monochromatic or multicolor light, or the like. The embodiments of the present disclosure are not limited thereto, provided that the organic light emitting devices can achieve to provide the light sources to the display panel 200.

In the following, taking the organic light emitting devices emitting white light as an example, the technical solutions in the following embodiments of the present disclosure will be described. In the embodiments of the present disclosure, the specific structure of the organic light emitting devices that emit white light is not limited. Exemplarily, in the organic light emitting devices, the light emitting layer 113 may be a white light emitting layer or a combination of a red light emitting layer, a green light emitting layer, and a blue light emitting layer. In the following, in following embodiments of the present disclosure, the light emitting layer 113 is the combination of the red light emitting layer, the green light emitting layer, and the blue light emitting layer, which is taken as an example to describe the present disclosure.

In a display device according to at least one embodiment of the present disclosure, for example, as shown in FIG. 1 and FIG. 3a, the light emitting layer 113 may comprise a red light emitting layer 1131, a green light emitting layer 1132, and a blue light emitting layer 1133 that are sequentially stacked on top of each other, and the red light emitting layer 1131, the green light emitting layer 1132, and the blue light emitting layer 1133 can emit red light, green light, and blue light respectively during work, and these light can be mixed with each other to achieve white light. It should be noted that the red light emitting layer 1131, the green light emitting layer 1132 and the blue light emitting layer 1133 are not limited to being sequentially stacked on top of each other in a direction perpendicular to the light source panel 100 as shown in FIG. 3a, and may also be disposed side by side in a direction parallel to the surface where the light source panel 100 is located, and there is no limitations on arrangement modes of the red light emitting layer 1131, the green light emitting layer 1132 and the blue light emitting layer 1133 in the present disclosure, so long as the light emitting devices can provide white light.

In a display device according to at least one embodiment of the present disclosure, as shown in FIG. 1 and FIG. 3a, the light source panel 100 may further comprise a pixel definition layer 114 for defining the light emitting units 110, and the pixel definition layer 114 can define arrangement positions of the light emitting units 110. For example, in at least one embodiment of the present disclosure, a material for forming the pixel definition layer 114 may be a transparent material and extends into the light transmission areas 130, so that, for example, the pixel definition layer 114 may function as a planarization layer, and may also facilitate the light reflected by the display panel 200 transmitting from the light transmission areas 130.

In a display device according to at least one embodiment of the present disclosure, the parallax barrier structure 120 disposed in the light source panel 100 is mainly used to implement the three-dimensional display function of the display device. There are many ways for disposing the parallax barrier structure 120 in the light source panel 100. In the following, several arrangement modes of the parallax barrier structure 120 and the corresponding structures of the light source panel 100 will be described through several embodiments.

For example, in at least one embodiment of the present disclosure, as shown in FIGS. 1 and 3a, the first electrode layer 112 may be a non-transparent electrode. For example, in the above case, the first electrode layer 112 may be configured to form a light splitting components 121 of the parallax barrier structure 120, that is, the light splitting components 121 shown in FIG. 1 and the first electrode layer 112 shown in FIG. 3a are the same structure. In the above case, the light emitting units 110 not only can provide the light source for the display panel 200, but also can have a parallax barrier function, thus, no additional light blocking layer needs to be provided on a side of the light source panel 100 away from the display panel 200, the structure of the light source panel 100 can be simplified, the overall thickness of the display device can be reduced, and the production cost can be reduced.

For example, in at least one embodiment of the present disclosure, the light source panel 100 may further comprise a first base substrate 101, and the first base substrate 101 may be disposed on a side of the light source panel away from the display panel 200. The first base substrate 101 may provide support for the light source panel 100, and a material of the first base substrate 101 is transparent so as to transmit light. In the embodiments of the present disclosure, the material for forming the first base substrate is not limited, for example, the first base substrate 101 may be a transparent substrate such as a glass substrate, a quartz substrate, a plastic substrate, or the like.

In the embodiments of the present disclosure, there is no limitation on the types of the first electrode layer and the second electrode layer. Exemplarily, the first electrode layer 112 and the second electrode layer 111 may be an anode and a cathode. For example, the first electrode layer 112 is one of the anode and the cathode, and the second electrode layer 111 is the other of the anode and the cathode, as long as the second electrode layer 111 is at least a half-transparent electrode (for example, a transparent electrode).

In the embodiments of the present disclosure, for example, the materials of the anode may comprise indium tin oxide (ITO), indium zinc oxide (IZO), indium gallium oxide (IGO), gallium zinc oxide (GZO), zinc oxide (ZnO), indium oxide ($In_2O_3$), Alumina Zinc (AZO), and Carbon Nanotubes, and the like. The materials of the cathode may comprise Ag, Al, Ca, In, Li, or Mg, or the like, or their alloys (for example, Mg—Ag alloy). For example, the materials for forming the second electrode layer 106 comprise indium tin oxide (ITO), indium zinc oxide (IZO), indium gallium oxide (IGO), or carbon nanotubes, or the like. Exemplarily, the second electrode layer 111 may be an anode made of a transparent ITO material, the first electrode layer 112 may be a cathode made of a metal aluminum material, and the first electrode layer 112 is non-transparent, so that the first electrode layer 112 may serve as the light splitting components 121 of the parallax barrier structure 120 at the same time.

For example, the specific structure of the organic light emitting device is not limited in the embodiments of the present disclosure. Exemplarily, the organic light emitting device may further comprise a hole transport layer disposed between the anode and the light emitting layer 113, and an electron transport layer disposed between the cathode and the light-emitting layer 113; in order to improve the efficiency of injecting electrons and holes into the light-emitting layer, the organic light emitting device may further comprise organic functional layers, such as an electron injection layer disposed between the cathode and the electron transport layer, and a hole injection layer disposed between the anode and the hole transport layer.

For example, the materials of the light emitting layer may comprise 8-hydroxyquinoline aluminum, 8-hydroxyquinoline aluminum, derivative of germanium, and the like; the materials of the electron injection layer may comprise lithium fluoride, lithium oxide, lithium boron oxide, potassium silicon oxide, cesium carbonate, 8-hydroxyquinoline aluminum-lithium, and the like; the materials of the electron transport layer comprise oxazole derivatives, metal chelates, azole compounds, quinoline derivatives, porphyrin derivatives, diazo derivatives, and heterocyclic derivatives of silicon, and the like; the materials of the hole transport layer may comprise polyparaphenylene vinylenes, polythiophenes, polysilanes, triphenylmethanes, triarylamines, hydrazone, pyrazolines, azoles, carbazoles, butadienes, and the like; the materials of the hole injection layer may comprise copper cyanide, molybdenum trioxide, 1-TNATA, 2-TNATA, polyaniline, PEDOT (polymers of 3,4-ethylene-dioxythiophene), and the like. It should be noted that the materials for forming the above-mentioned structures in the organic light emitting device are not limited to the above-mentioned ranges, and may be selected according to specific needs, and the embodiments of the present disclosure are not limited thereto.

Figure 3B:
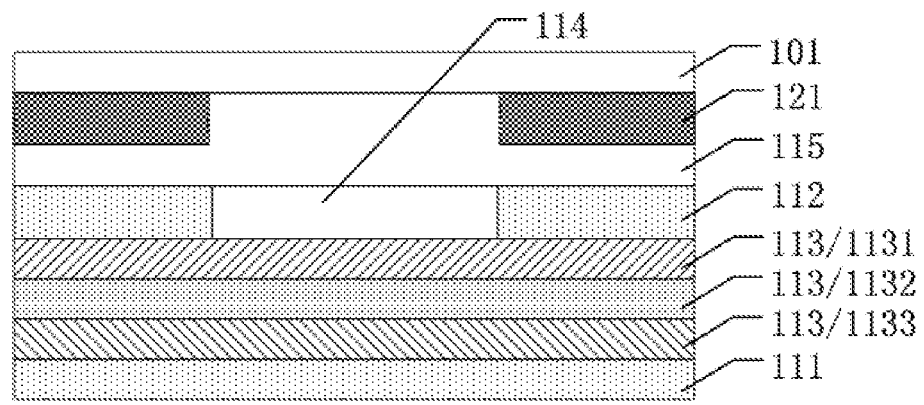
FIG. 3b is another schematic structural diagram of the area A shown in FIG. 1.

For example, in at least one embodiment of the present disclosure, FIG. 3b is another schematic structural diagram, which is a sectional view, of the area A shown in FIG. 1. For example, as shown in FIG. 1 and FIG. 3b, the light splitting components 121 included in the parallax barrier structure 120 may be a black matrix, and the first electrode layer 112 is at least partially overlapped with the black matrix. The black matrix may be provided with an anti-reflection structure, so the light from external environment is prevented from interfering the display images of the display device after being reflected by the light splitting components 121, and the display effect can be improved. For example, the first electrode layer 112 may be a reflective electrode, so that all light emitted by the light emitting units 110 enter the display panel 200, thereby improving the utilization rate of light and reducing power consumption. Alternatively, in the case where the black matrix has reflective functions, the first electrode layer 112 may be a transparent electrode. For example, an orthographic projection of the first electrode layers 112 on the surface, where the light source panel 100 is located, is located within an orthogonal projection of the black matrix on the surface where the light source panel 100 is located. In this way, the first electrode layer 112 can be prevented from blocking a part of an opening area of the black matrix and from reducing the aperture ratio of the pixel units of the display device. For example, the relative positional relationship between the first electrode layer 112 and the black matrix is not limited to the arrangement above-mentioned, for example, the first electrode layer 112 and the black matrix may also be partially overlapped, as long as the arrangement of the first electrode layer 112 and the black matrix can guarantee the display function of the display device, and the embodiments of the present disclosure are not limited thereto.

For example, in at least one embodiment of the present disclosure, the light source panel may further comprise a planarization layer 115, and the planarization layer 115 may be disposed between the black matrix and the light emitting units 110. The planarization layer 115 has a planarity effect, so as to make the disposing position of the black matrix accurate, and the planarization layer 115 may serve as a transition film layer between the black matrix and the light emitting units 110, so the bonding of the black matrix and the light emitting unit 110 is more stable. In addition, the planarization layer 115 may prevent the light emitting unit 110 from being affected by harmful impurities, ions, static electricity or the like in the black matrix. In embodiments of the present disclosure, the planarization layer 115 may be transparent to ensure light transmission. For example, the materials of the planarization layer 115 may comprise organic materials such as resins and the like, or inorganic materials having good light transmittance rate such as silicon nitrides or silicon oxides or the like.

Figure 3C:
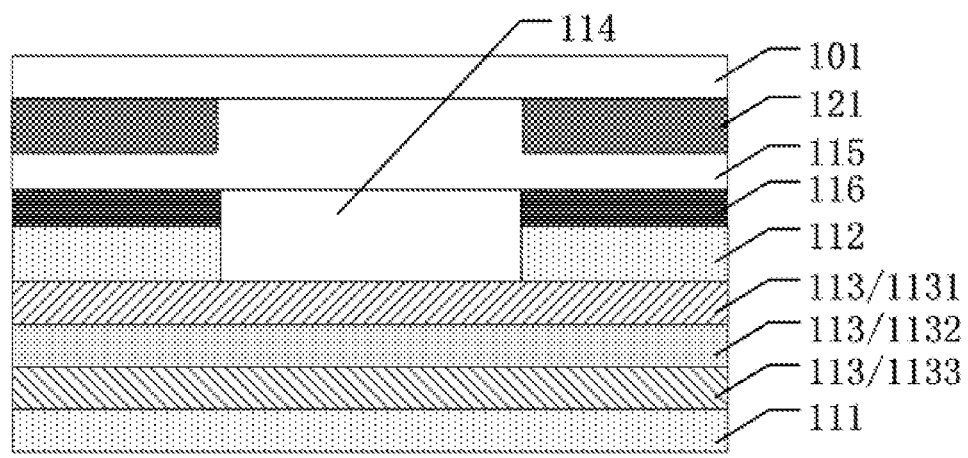
FIG. 3c is still another schematic structural diagram of the area A shown in FIG. 1.

For example, in at least one embodiment of the present disclosure, FIG. 3c is still another schematic structural diagram, which is a sectional view, of the area A shown in FIG. 1. For example, as shown in FIG. 1 and FIG. 3c, a first reflective layer 116 may be disposed between the light splitting components 121 and the light emitting units 110. The first reflective layer 116 has a function of reflecting light, and may be, for example, a metal reflective layer. In this way, the light emitting units 110 can be designed according to actual needs without being limited by a case where the first electrode layer 112 is provided as a reflective electrode or the like.

In a display device provided by at least one embodiment of the present disclosure, in a case where the light splitting components 121 are non-transparent, the display device can have a three-dimensional display function, and if the light splitting components 121 can also be converted into a transparent state, that is, the light source panel 100 may also be in a transparent state, the display device can have a two-dimensional display function, that is, the display device can implement switching between two-dimensional display function and three-dimensional display function.

In the display device provided by at least one embodiment of the present disclosure, for example, the parallax barrier structure 120 may be a liquid crystal grating or an electrochromic grating. For example, in the liquid crystal grating and the electrochromic grating, the non-transparent areas may be converted into a transparent state after switching a voltage signal, or may be restored to a non-transparent state again. Hereinafter, in the following embodiments of the present disclosure, the parallax barrier structure 120 is a non-transparent state after being applied with a voltage signal instead of being a transparent state, which is taken as an example to describe the present disclosure, and the areas, which can be converted into a transparent state after being applied with a voltage signal, in the parallax barrier structure 120 may be used as the light splitting components 121.

Hereinafter, in the following several embodiments of the present disclosure, two cases, in which the parallax barrier structure 120 is an electrochromic grating and the parallax barrier structure 120 is a liquid crystal grating, will be described.

For example, in at least one embodiment of the present disclosure, the parallax barrier structure 120 in the light source panel 100 is an electrochromic grating. For example, the light splitting components 121 may comprise a third electrode layer, an electrochromic layer, and a fourth electrode layer that are sequentially stacked on top of each other, FIG. 4a is a schematic structural diagram, which is a sectional view, of light splitting components according to an embodiment of the present disclosure.

Figure 4A:
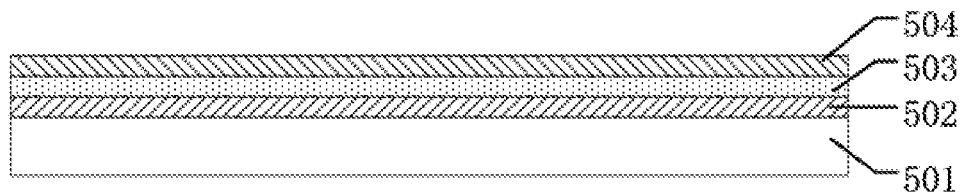
FIG. 4a is a schematic structural diagram of light splitting components according to an embodiment of the present disclosure.

For example, in at least one embodiment of the present disclosure, as shown in FIG. 1 and FIG. 4a, the light splitting components 121 may comprise a third electrode layer 502, an electrochromic layer 503, and a fourth electrode layer 504 that are sequentially stacked on the second base substrate 501, and the third electrode layer 502 and the fourth electrode layer 504 are transparent electrodes. For example, one of the third electrode layer 502 and the fourth electrode layer 504 is a stripe electrode (corresponding to a non-transparent area to be obtained) and the other is a planar electrode, or both are stripe electrodes. For example, the third electrode layer 502 and the fourth electrode layer 504 may be disposed on the same side of the second base substrate 501, and also may be disposed on different sides of the second base substrate 501. In the embodiment of the present disclosure, the specific positions of the third electrode layer 502 and the fourth electrode layer 504 in the light source panel are not limited, as long as the electrochromic layer 503 is disposed between the third electrode layer 502 and the fourth electrode layer 504.

In at least one embodiment of the present disclosure, for example, the electrochromic layer 503 is in a transparent state without applying an electric field, and a voltage may be applied to the third electrode layer 502 and the fourth electrode layer 504 so that an electric field is formed therebetween, and the electrochromic layer 503 can be converted into a non-transparent state by applying the electric field to the electrochromic layer 503. Exemplarily, the electric field can adjust transparency degree of the electrochromic layer 503, for example, the electrochromic layer 503 changes from a transparent state to a dark state until to a non-transparent state after the electric field is applied. The electrochromic layer 503 in the non-transparent state may serve as the light splitting components 121, and may also block ambient light or light emitted from the display panel from passing through the light splitting components 121, thereby achieving the three-dimensional display function of the display device.

In at least one embodiment of the present disclosure, the second base substrate 501 may be a transparent polycarbonate plate, a glass plate, a plastic plate, an acrylic plate, or the like; the materials of the electrochromic layer 503 may comprise tungsten trioxide, polythiophenes and its derivatives, viologens, tetrathiafulvalene or metal phthalocyanine compounds, or the like; the materials of the third electrode layer 502 and the fourth electrode layer 504 are transparent conductive materials, for example, may be indium tin oxide (ITO), indium oxide Zinc (IZO), indium gallium oxide (IGO), gallium zinc oxide (GZO), zinc oxide (ZnO), indium oxide ($In_2O_3$), aluminum oxide zinc (AZO), and carbon nanotubes, and the like.

It should be noted that, there is no limitation on the boundary between the transparent state and the non-transparent state in the embodiments of the present disclosure. Exemplarily, "transparent" refers to a state where the light transmittance rate is greater than 75%, "non-transparent" refers to a state where the light transmittance rate is less than 25%, and "half-transparent" refers to partially light transmission, for example, a light transmittance rate is 25% to 75%, "transflective" refers to partial light reflection, such as a reflectivity rate is 25% to 75%.

Figure 4B:
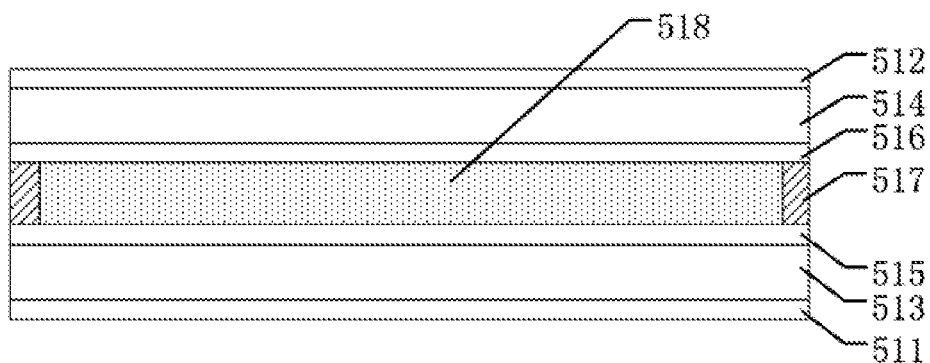
FIG. 4b is another schematic structural diagram of light splitting components according to an embodiment of the present disclosure.

For example, in at least one embodiment of the present disclosure, the parallax barrier structure 120 in the light source panel 100 is a liquid crystal grating, and FIG. 4b is another schematic structural diagram, which is a sectional view, of light splitting components according to an embodiment of the present disclosure. For example, as shown in FIG. 1 and FIG. 4b, the liquid crystal grating may comprise a first substrate 513, a second substrate 514, and a second liquid crystal layer 518 disposed between the first substrate 513 and the second substrate 514, the first substrate 513 and the second substrates 514 are bonded to each other through a second sealant 517 to form a liquid crystal cell. A first polarizing plate 511 and a second polarizing plate 512 are disposed on two opposite sides of the second liquid crystal layer 518, for example, the first polarizing plate 511 may be disposed on a side of the first substrate 513 away from the second substrate 514, the second polarizing plate 512 may be disposed on a side of the second substrate 514 away from the first substrate 513, and polarization axes of the first polarizing plate 511 and the second polarizing plate 512 may be parallel or perpendicular to each other. A fifth electrode layer 515 and a sixth electrode layer 516 are disposed on two opposite sides of the second liquid crystal layer 518, for example, the fifth electrode layer 515 may be disposed on a side of the first substrate 513 facing the second substrate 514, the sixth electrode layer 516 may be disposed on a side of the second substrate 514 facing the first substrate 513. For example, one of the fifth electrode layer 515 and the sixth electrode layer 516 is a stripe electrode and the other is a planar electrode, or both are stripe electrodes.

In at least one embodiment of the present disclosure, as shown in FIG. 4b, in the case where a voltage is applied to the fifth electrode layer 515 and the sixth electrode layer 516, for example, a vertical electric field is formed between the first substrate 513 and the second substrate 514, the electric field can control the deflection degree of the liquid crystal molecules in the liquid crystal layer 518, therefore, under the cooperation of the first polarizing plate 511 and the second polarizing plate 512, the transmittance rate of the light passing through the liquid crystal grating can be controlled, and thus the liquid crystal grating can be switched from the transparent state to the non-transparent state. It should be noted that, in the present example, the first polarizing plate 511 and the second polarizing plate 512 are not limited to be located on outer sides of the first substrate 513 and the second substrate 514 as shown in FIG. 4b, and also may be respectively disposed on inner sides of the first substrate 513 and the second substrate 514; similarly, the fifth electrode layer 515 and the sixth electrode layer 516 are not limited to be located on inner sides of the first substrate 513 and the second substrate 514 as shown in FIG. 4b, and also may be respectively disposed on outsides of the first substrate 513 and the second substrate 514, provided that the deflection of the liquid crystal molecules in the liquid crystal layer 518 can be controlled to control transmission degree of the light, the technical effect that the liquid crystal grating may be switched between the transparent state and the non-transparent state can be achieved.

In at least one embodiment of the present disclosure, the materials of the fifth electrode layer 515 and the sixth electrode layer 516 are transparent conductive materials, such as indium tin oxide (ITO), indium zinc oxide (IZO), indium gallium oxide (IGO), and oxide. Zinc and zinc (GZO), zinc oxide (ZnO), indium oxide ($In_2O_3$), aluminum oxide zinc (AZO), carbon nanotubes, and the like.

It should be noted that in the implementations of the present disclosure, in the case where the display device can achieve two-dimensional display, that is, the light source panel 100 can be in a transparent state, that is, each structure in the light source panel may be a transparent structure. In the above case, the light emitting units 110 are transparent structures, and the first electrode layer 112 and the second electrode layer 111 included therein may also be transparent electrodes.

In the display device according to at least one embodiment of the present disclosure, there is no limitation on the type of the display panel. For example, the display panel may be a reflective liquid crystal display panel, a transflective liquid crystal display panel, an electronic paper display panel, or the like, as long as the display panel can display images by reflecting light.

For example, in at least one embodiment of the present disclosure, the display panel 200 is a reflective liquid crystal display panel. As shown in FIG. 1, the display panel 200 may comprise an array substrate 210 and a color film substrate 240, and a first liquid crystal layer 260 disposed between the array substrate 210 and the color film substrate 240. The array substrate 210 and the color filter substrate 240 are bonded with each other by a first sealant 230 to form a liquid crystal cell. A second reflective layer 220 may be disposed on a side of the array substrate 210 facing the first liquid crystal layer 260, and the second reflective layer 220 may reflect the light from external environment or the light provided by the light emitting units 110.

For example, in at least one embodiment of the present disclosure, the display panel 200 may further comprise a polarizing layer 250. The polarizing layer 250 may be disposed between the first liquid crystal layer 260 and the light source panel 100, for example, the polarizing layer 250 may be disposed on the side of the color filter substrate 240 facing the light source panel 100 as shown in FIG. 1.

At least one embodiment of the present disclosure provides display equipment, and the display equipment may comprise the display device in any one of the embodiments above-mentioned.

For example, in at least one embodiment of the present disclosure, the display equipment may be any products or components that have a display function and comprise the display device in any one of the embodiments above-mentioned, such as a liquid crystal display, an electronic paper display, an OLED display device, a mobile phone, a tablet computer, a television, a notebook computer, a digital photo frame, or a navigator and the like.

At least one embodiment of the present disclosure provides a light source panel, the light source panel comprises a parallax barrier structure and light emitting units, the parallax barrier structure comprises a plurality of light splitting components, and the light splitting components comprise at least a non-transparent state. The portions between the adjacent light splitting components are light transmission area, and the light emitting units at least partially overlap with the light splitting components in a direction perpendicular to the light source panel.

For example, in the light source panel according to at least one embodiment of the present disclosure, the light emitting units are organic light emitting devices, and each of the organic light emitting devices comprises at least a first electrode layer, a light emitting layer and a second electrode layer that are sequentially stacked on top of each other.

For example, in the light source panel according to at least one embodiment of the present disclosure, for example, the first electrode layer is a non-transparent electrode, and the first electrode layer is configured for the light splitting components of the parallax barrier structure.

For example, in the light source panel according to at least one embodiment of the present disclosure, for example, the parallax barrier structure comprises a black matrix as the light splitting components, and the first electrode layer is at least partially overlapped with the black matrix.

For example, in the light source panel according to at least one embodiment of the present disclosure, for example, the parallax barrier structure is a liquid crystal grating or an electrochromic grating, and the liquid crystal grating or the electrochromic grating comprises portions that are transformed into a non-transparent state after being applied with a voltage signal and functions as the light splitting components.

It should be noted that, in the light source panel according to at least one embodiment of the present disclosure, the structure of the light source panel is not limited to the above description, and for the specific structure of the light source panel, reference may be made to the related content of the light source panel in the embodiments above-mentioned (the embodiments relating to the display device), which are not described herein again.

At least one embodiment of the present disclosure provides a method for manufacturing a light source panel, and the method comprises: providing a first base substrate; forming a parallax barrier structure on the first base substrate; and then forming light emitting units on the parallax barrier structure; wherein the parallax barrier structure comprises a plurality of light splitting components, the light splitting components comprise at least a non-transparent state, and the light transmission areas are located in spaces between adjacent light splitting components, and the light emitting units at least partially overlap with the light splitting components in a direction perpendicular to the light source panel. In the embodiments of the present disclosure, for the structure of the parallax barrier structure and the specific structures of the light emitting units, reference may be made to related contents in the embodiments above-mentioned (embodiments relating to the light source panel and the display device), which are not described herein again.

For example, in at least one embodiment of the present disclosure, the light splitting components may define the positions of the light transmission areas. For example, the areas between adjacent light splitting components are the light transmission areas.

Figure 5A:
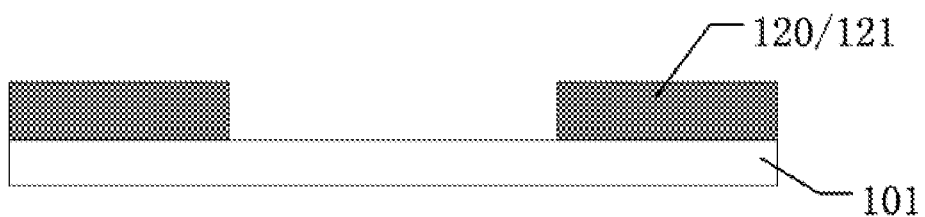
FIG. 5a to FIG. 5f are process diagrams of a method for manufacturing a light source panel according to an embodiment of the present disclosure.

FIG. 5a to FIG. 5f are process diagrams of a method for manufacturing a light source panel according to an embodiment of the present disclosure, FIG. 5a to FIG. 5f are schematic diagrams of a partial structure of a light source panel. For example, as shown in FIG. 5a to FIG. 5f, taking the structure of the light source panel shown in FIG. 3b as an example, a method for manufacturing a light source panel according to at least one embodiment of the present disclosure may comprise the following processes:

As shown in FIG. 5a, a first base substrate 101 is provided, and a parallax barrier structure film layer is deposited on the first base substrate 101, and a patterning process is performed on the parallax barrier structure film layer to form a parallax barrier structure 120, the parallax barrier structure 120 may comprise a plurality of light splitting components (for example, a black matrix) which are spaced apart from each other. The areas between adjacent light splitting components 121 may be light transmission areas.

In the embodiment of the present disclosure, for example, the patterning process may be a photolithographic patterning process, for example, the patterning process can comprise: coating a photoresist layer on a structure layer that needs to be patterned, and exposing the photoresist layer by using a mask plate, and developing the exposed photoresist layer to obtain a photoresist pattern, and using the photoresist pattern as a mask to etch the structure layer, and then optionally removing the photoresist pattern.

Figure 5B:
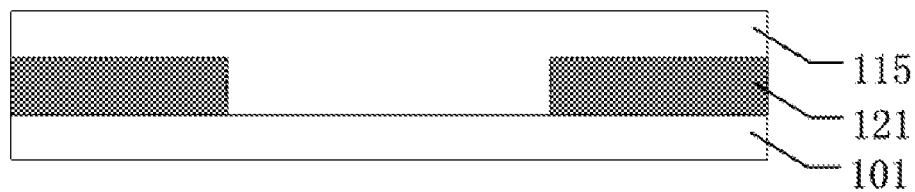

As shown in FIG. 5b, a planarization layer 115 is formed on the first base substrate 101 on which the parallax barrier structure 120 is formed. A material of the planarization layer 115 may be a transparent material.

Figure 5C:
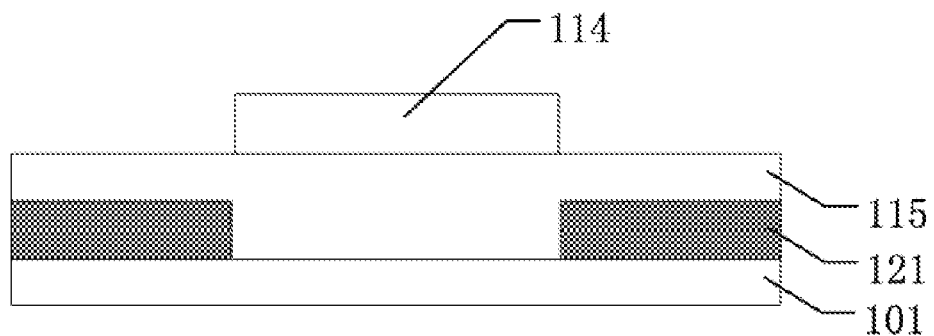

As shown in FIG. 5c, a film layer of a pixel definition layer is deposited on the planarization layer 115 and is patterned to form a pixel definition layer 114. A material of the pixel definition layer 114 is a transparent material to ensure light passing through the pixel definition layer 114.

Figure 5D:
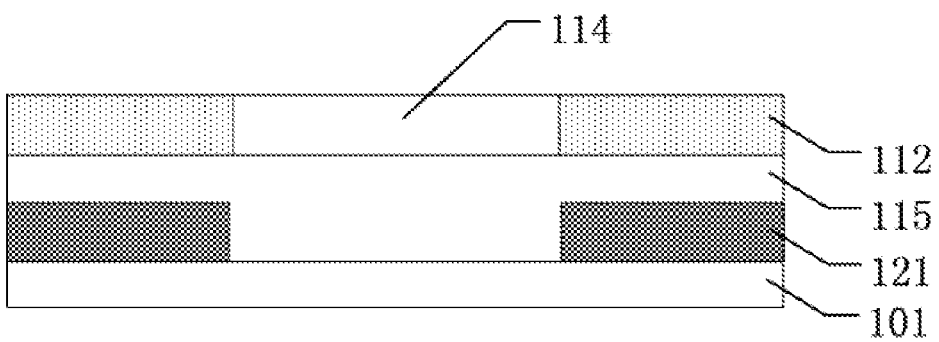

As shown in FIG. 5d, organic light emitting devices or partial structures of the organic light emitting devices are formed in areas defined by the pixel definition layer 114, for example, a first electrode layer 112 is formed in the areas defined by the pixel definition layer 114.

Figure 5E:
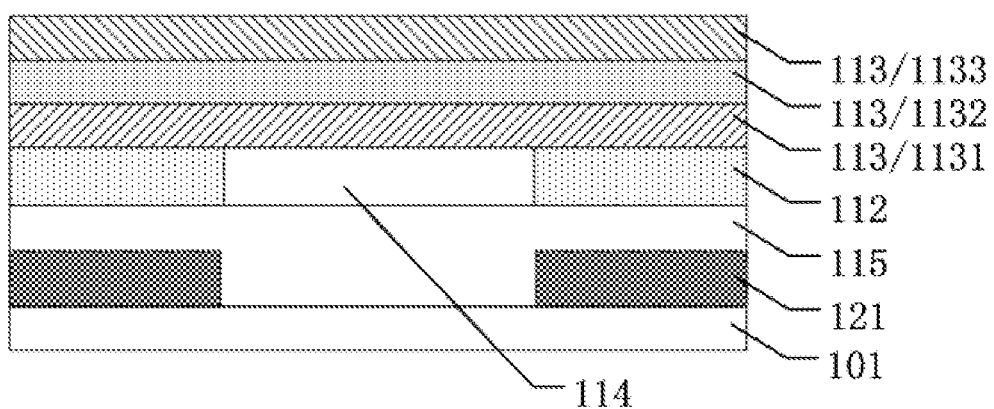

As shown in FIG. 5e, a light emitting layer 113 is deposited on the first base substrate 101 on which the first electrode layer 112 is formed, For example, a stack layer comprising a red light emitting layer 1131, a green light emitting layer 1132, and a blue light emitting layer 1133 may be deposited.

It should be noted that the organic light emitting device also may comprise structures such as electron injection layer, electron transport layer, hole injection layer, and hole transport layer, and the like, the above structures and the light emitting layer 113 may be deposited on the entire surface of the first base substrate 101 as shown in FIG. 5e, or may also be formed in the areas defined by the pixel definition layer 114, for example, the plurality of structures above-mentioned may be formed in the areas defined by the pixel definition layer 114 by ink jet printing.

Figure 5F:
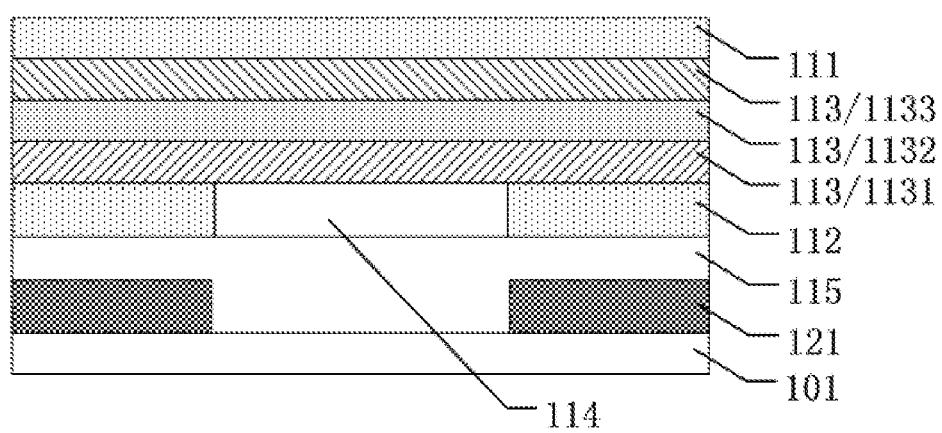

As shown in FIG. 5f, a second electrode layer 111 is formed on the first base substrate 101, the second electrode layer 111 is a transparent electrode, so that the light emitted from the light emitting layer 113 can pass through the second electrode layer 111.

It should be noted that in the method for manufacturing a light source panel according to the above embodiments of the present disclosure, each structure in the light source panel can be referred to the related description in the foregoing embodiments (the embodiments relating to the light source panel and the display device), which are not described herein again.

The embodiments of the present disclosure provide a light source panel and a display device, and can have at least one of the following advantageous effects:

(1) At least one embodiment of the present disclosure provides a light source panel and a display device, the light emitting units and the parallax barrier structure provided in the light source panel can not only provide a front light source for the display panel of reflection type to improve the quality of the display images, but also make the display device have a three-dimensional display function.

(2) In the display device according to at least one embodiment of the present disclosure, if the parallax barrier structure in the light source panel can switch between the transparent state and the non-transparent state, the display device can achieve a mode switching between two-dimensional display function and the three-dimensional display function.

(3) In the light source panel according to at least one embodiment of the present disclosure, in the case where the light splitting components of the parallax barrier structure of the light source panel comprise the electrodes of the light emitting units, the structure of the light source panel can be simplified, the thickness of the display device can be reduced, and production costs can be reduced.

For the present disclosure, the following points should be noted:

(1) The accompanying drawings in the embodiments of the present disclosure only involve the structure(s) in connection with the embodiment(s) of the present disclosure, and other structure(s) can be referred to in common design(s).

(2) For the purpose of clarity only, in accompanying drawings for illustrating the embodiment(s) of the present disclosure, the thickness a layer or area may be enlarged or narrowed, that is, the drawings are not drawn in a real scale.

(3) In case of no conflict, the embodiments of the present disclosure and the features in the embodiment(s) can be combined with each other to obtain new embodiment(s).

What have been described above are only specific implementations of the present disclosure, the protection scope of the present disclosure is not limited thereto, and the protection scope of the present disclosure should be based on the protection scope of the claims.

What is claimed is:

1. A display device, comprising:
a display panel of reflection type; and
a light source panel disposed on a light emitting side of the display panel and being parallel to the display panel, the light source panel including a parallax barrier structure and light emitting units, and the light emitting units being capable of irradiating the display panel during operation,
wherein the light source panel comprises light emitting areas and light transmission areas, the light emitting units are disposed in the light emitting areas, and the parallax barrier structure is disposed on one side of the light emitting units away from the display panel, the parallax barrier structure comprises light splitting components, the light splitting components comprise at least a non-transparent state, the light transmission areas are located in spaces between adjacent light splitting components, and the light emitting units at least partially overlap with the light splitting components in a direction perpendicular to the light source panel,
the display panel of reflection type comprises a plurality of first pixel units adapted to provide a first parallax image and a plurality of second pixel units adapted to provide a second parallax image, the light splitting components are at a side of the light emitting units that is away from the display panel of reflection type and opposite to a light emitting side of the light emitting units, and when the light splitting components are in the non-transparent state, the light splitting components are adapted to enable the first parallax image and the second parallax image to be respectively displayed at different positions.

2. The display device according to claim 1, wherein orthographic projections of the spaces between the adjacent light splitting components on a surface where the light source panel is located coincide with orthogonal projections of the light transmission areas on the surface where the light source panel is located.

3. The display device according to claim 1, wherein orthographic projections of the light emitting units on a surface where the light source panel is located are located within orthogonal projections of the light splitting components on the surface where the light source panel is located.

4. The display device according to claim 1, wherein the light emitting units are organic light emitting devices, and each of the organic light emitting devices comprises at least a first electrode layer, a light emitting layer and a second electrode layer that are sequentially stacked on top of each other, and the first electrode layer is disposed on a side of the light emitting layer away from the display panel, and the second electrode layer is a transparent electrode.

5. The display device according to claim 4, wherein the light emitting layer is a white light emitting layer or comprises a red light emitting layer, a green light emitting layer and a blue light emitting layer that are stacked on top of each other.

6. The display device according to claim 1, wherein the light source panel further comprises a pixel definition layer for defining the light emitting units, and the pixel definition layer comprises a transparent material and extends into the light transmission area.

7. The display device according to claim 4, wherein the first electrode layer is a non-transparent electrode, and the first electrode layer is configured for the light splitting components of the parallax barrier structure.

8. The display device according to claim 4, wherein the parallax barrier structure comprises a black matrix as the light splitting components, and the first electrode layer is at least partially overlapped with the black matrix.

9. The display device according to claim 8, wherein the first electrode layer is a reflective electrode, and an orthographic projection of the first electrode layer on a surface, where the light source panel is located, is located within an orthogonal projection of the black matrix on the surface where the light source panel is located.

10. The display device according to claim 4, wherein the parallax barrier structure is a liquid crystal grating or an electrochromic grating, and the liquid crystal grating or the electrochromic grating comprises portions that are transformed into a non-transparent state after being applied with a voltage signal and functions as the light splitting components, and the first electrode layer is a transparent electrode.

11. A light source panel, comprising:
a parallax barrier structure and light emitting units,
wherein the light source panel is disposed on a light emitting side of a display panel of reflection type, the parallax barrier structure comprises a plurality of light splitting components, the plurality of light splitting components comprise at least a non-transparent state, and the light transmission areas are located in spaces between adjacent light splitting components, and the light emitting units at least partially overlap with the light splitting components in a direction perpendicular to the light source panel, the display panel of reflection type comprises a plurality of first pixel units adapted to provide a first parallax image and a plurality of second pixel units adapted to provide a second parallax image, the light splitting components are at a side of the light emitting units that is away from the display panel of reflection type and opposite to a light emitting side of the light emitting units, and when the light splitting components are in the non-transparent state, the light splitting components are adapted to enable the first parallax image and the second parallax image to be respectively displayed at different positions.

12. The light source panel according to claim 11, wherein the light emitting units are organic light emitting devices, and each of the organic light emitting devices comprises at least a first electrode layer, a light emitting layer and a second electrode layer that are sequentially stacked on top of each other.

13. The light source panel according to claim 12, wherein the first electrode layer is a non-transparent electrode, and the first electrode layer is configured for the light splitting components of the parallax barrier structure.

14. The light source panel according to claim 12, wherein the parallax barrier structure comprises a black matrix as the light splitting components, and the first electrode layer is at least partially overlapped with the black matrix.

15. The light source panel according to claim 14, wherein the first electrode layer is a reflective electrode, and an orthographic projection of the first electrode layer on the surface, where the light source panel is located, is located within an orthogonal projection of the black matrix on the surface where the light source panel is located.

16. The light source panel according to claim 11, wherein the parallax barrier structure is a liquid crystal grating or an electrochromic grating, and the liquid crystal grating or the electrochromic grating comprises portions that are transformed into a non-transparent state after being applied with a voltage signal and functions as the light splitting components.

17. The display device according to claim 2, wherein orthographic projections of the light emitting units on the surface where the light source panel is located are located within orthogonal projections of the light splitting components on the surface where the light source panel is located.

18. The display device according to claim 2, wherein the light source panel further comprises a pixel definition layer for defining the light emitting units, and the pixel definition layer comprises a transparent material and extends into the light transmission area.

19. The light source panel according to claim 11, wherein the light emitting units are organic light emitting devices, and each of the organic light emitting devices comprises at least a first electrode layer, a light emitting layer and a second electrode layer that are sequentially stacked on top of each other, and the first electrode layer is disposed on a side of the light emitting layer away from the display panel, and the second electrode layer is a transparent electrode; and orthographic projections of the light emitting units on a surface where the light source panel is located are located entirely within orthogonal projections of the light splitting components on the surface where the light source panel is located, in a manner of one-to-one correspondence.

20. A display device, comprising:
a display panel of reflection type; and
a light source panel disposed on a light emitting side of the display panel and being parallel to the display panel, the light source panel including a parallax barrier structure and light emitting units, and the light emitting units being capable of irradiating the display panel during operation,
wherein the light source panel comprises light emitting areas and light transmission areas, the light emitting units are disposed in the light emitting areas, and the parallax barrier structure is disposed on one side of the light emitting units away from the display panel, the parallax barrier structure comprises light splitting components, the light splitting components comprise at least a non-transparent state, the light transmission areas are located in spaces between adjacent light splitting components, and the light emitting units at least partially overlap with the light splitting components in a direction perpendicular to the light source panel;
the light emitting units are organic light emitting devices, and each of the organic light emitting devices comprises at least a first electrode layer, a light emitting layer and a second electrode layer that are sequentially stacked on top of each other, and the first electrode layer is disposed on a side of the light emitting layer away from the display panel, and the second electrode layer is a transparent electrode; and
orthographic projections of the light emitting units on a surface where the light source panel is located are located entirely within orthogonal projections of the light splitting components on the surface where the light source panel is located, in a manner of one-to-one correspondence.

* * * * *